United States Patent [19]

Ulmer

[11] Patent Number: 4,584,491
[45] Date of Patent: Apr. 22, 1986

[54] TTL TO CMOS INPUT BUFFER CIRCUIT FOR MINIMIZING POWER CONSUMPTION

[75] Inventor: Richard W. Ulmer, Austin, Tex.

[73] Assignee: Motorola, Inc., Schaumburg, Ill.

[21] Appl. No.: 570,114

[22] Filed: Jan. 12, 1984

[51] Int. Cl.[4] .......................................... H03K 19/094
[52] U.S. Cl. .................................... 307/475; 307/443; 307/451; 307/579
[58] Field of Search ............... 307/443, 451, 475, 574, 307/576, 579, 581, 584, 264

[56] References Cited

U.S. PATENT DOCUMENTS

| | | | |
|---|---|---|---|
| 3,651,340 | 3/1972 | Cliff | 307/451 |
| 3,675,144 | 7/1972 | Zuk | 307/475 X |
| 3,980,896 | 9/1976 | Kato | 307/451 X |
| 4,274,014 | 6/1981 | Schade, Jr. | 307/451 X |
| 4,365,316 | 12/1982 | Iwahashi et al. | 307/450 X |
| 4,437,024 | 3/1984 | Wacyk | 307/475 |
| 4,486,671 | 12/1984 | Ong | 307/571 X |
| 4,501,978 | 2/1985 | Gentile et al. | 307/475 |

FOREIGN PATENT DOCUMENTS 0111525  7/1983  Japan ........................... 307/475

OTHER PUBLICATIONS

Dingwall, "TTL-to-CMOS Buffer Circuit", RCA Technical Notes, TN No. 1114, Jun. 11, 1975 pp. 1-3.

Primary Examiner—Stanley D. Miller
Assistant Examiner—D. R. Hudspeth
Attorney, Agent, or Firm—Anthony J. Sarli, Jr.; Jeffrey Van Myers; Robert L. King

[57] ABSTRACT

A buffer circuit comprising a current source transistor, a switching transistor and a current sink transistor coupled in series is provided. Control electrodes of the switching transistor and current sink transistor are directly connected and coupled to an input voltage. The buffer circuit has an accurate switchpoint voltage which is substantially process and temperature independent, and the circuit does not consume power for input voltages having low and high CMOS levels.

11 Claims, 2 Drawing Figures

TTL TO CMOS INPUT BUFFER CIRCUIT FOR MINIMIZING POWER CONSUMPTION

TECHNICAL FIELD

This invention relates generally to buffer circuits and, more particularly, to a buffer circuit having a single input terminal and which minimizes power consumption.

BACKGROUND ART

Although there are numerous forms of buffer circuits which are capable of buffering input voltages having TTL voltage levels to provide output voltages having MOS voltage levels, such buffer circuits typically consume power when at least one of the MOS voltage levels is provided. A well known buffer circuit utilizes an N-channel depletion load transistor connected in series with an N-channel transistor having its control electrode connected to an input voltage. The load transistor functions as a constant current source. The N-channel transistor is fabricated to have a switchpoint threshold voltage which is equal to a mid-range value of the TTL trip point voltage. Disadvantages with this buffer circuit include the fact that when the input voltage makes the N-channel transistor conductive, current flows through both the load transistor and the N-channel transistor thereby dissipating a large amount of power. However, because both transistors are of the same conductivity type and have near identical processing steps, the buffer circuit exhibits a substantially constant switchpoint voltage with respect to processing variations and temperature. On the other hand, a conventional CMOS inverter circuit comprising a P-channel transistor connected in series to an N-channel transistor does not provide a constant switchpoint with respect to process and temperature due to the processing differences between the transistors of opposite conductivity. To overcome the power dissipation problem of an all N-channel buffer circuit, others have utilized an additional power down transistor of the same conductivity type to separately power up and power down the circuit. Such a circuit is taught by U.S. Pat. No. 4,384,220 by Segawa et al. However, such circuits continue to dissipate power for at least one level of the input voltage. Also, additional control voltages are required.

SUMMARY OF THE INVENTION

It is an object of the present invention to provide an improved TTL to CMOS buffer circuit.

Another object of the present invention is to provide an improved buffer circuit having an accurate switchpoint in response to TTL input voltages and which is powered down in response to CMOS input voltages.

Yet another object of the present invention is to provide an improved buffer circuit which minimizes power consumption.

In carrying out the above and other objects of the present invention, there is provided, in one form, a TTL to CMOS input buffer having a high impedance current source means for providing a precise reference current. In a preferred form, the current source means is implemented as a depletion type MOS transistor of a first conductivity type with zero gate-to-source voltage. A second transistor of a second conductivity type has a first current electrode coupled to the current source means, a second current electrode coupled to an output terminal for providing an output voltage having CMOS voltage levels, and a control electrode. A third transistor of the first conductivity type has a first current electrode coupled to the output terminal, and a second current electrode coupled to a reference voltage. A control electrode of the third transistor is connected directly to the control electrode of the second transistor and provides an input terminal for receiving an input voltage having TTL voltage levels. The input buffer circuit is powered down for input voltages outside the TTL voltage range but has a very accurate switchpoint for TTL input voltages.

The above and other objects, features and advantages of the present invention will be more clearly understood from the following detailed description taken in conjunction with the following drawings.

DETAILED DESCRIPTION OF THE PRESENT INVENTION

Figure 1:
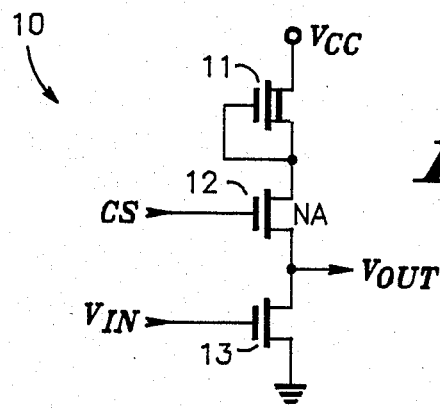
FIG. 1 illustrates in schematic form an MOS inverter circuit with a power down function known in the art.

Shown in FIG. 1 is an MOS inverter circuit 10 known in the art and having all N-channel MOS transistors. A depletion type transistor 11 has a drain connected to a supply voltage $V_{CC}$, and both a gate and a source connected together to a drain of a natural type power down transistor 12. A gate of transistor 12 is connected to a chip select control voltage, CS. A source of transistor 12 is connected to a drain of an enhancement type transistor 13 for providing an output voltage $V_{OUT}$. A gate of transistor 13 is connected to an input voltage $V_{IN}$, and a source of transistor 13 is connected to a ground terminal.

Inverter circuit 10 powers up and down in response to control voltage CS. Since transistor 12 is a natural type device, its threshold voltage is around zero volts. When the CS signal is at a high level, transistor 12 is conductive and inverter circuit 10 is powered up. When the CS signal is at a low level, transistor 12 is nonconductive and inverter circuit 10 is powered down. When powered up, inverter circuit 10 provides an output voltage $V_{OUT}$ having the opposite logic state of input voltage $V_{IN}$. For example, when $V_{IN}$ has a low logic level value, transistor 13 is nonconductive and $V_{OUT}$ is at a high logic level value. However, when $V_{IN}$ has a high logic level value, transistor 13 is conductive to make $V_{OUT}$ have a low logic level. Unfortunately, when transistor 13 is conductive, inverter circuit 10 consumes power by virtue of the fact that transistors 11, 12 and 13 are all conductive. Also, an additional control voltage such as a chip select voltage must exist or be provided from elsewhere.

Figure 2:
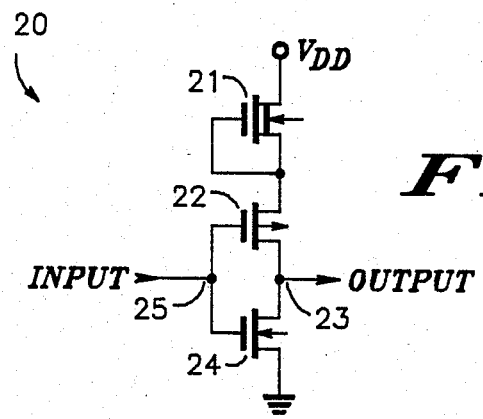
FIG. 2 illustrates a TTL to CMOS buffer circuit in schematic form in accordance with the present invention.

Shown in FIG. 2 is a TTL to CMOS buffer circuit 20 in accordance with the present invention. An N-channel depletion type transistor 21 has a drain coupled to a positive supply voltage $V_{DD}$. Both a gate and a source of transistor 21 are connected together and coupled to a source of a P-channel transistor 22. A drain of transistor 22 is coupled to a drain of an N-channel transistor 24 at an output terminal 23. Both a gate of transistor 22 and a gate of transistor 24 are connected together at a node 25 for receiving an input voltage. A source of transistor 24 is coupled to a voltage reference referred to as ground. While specific N-channel and P-channel MOS devices are shown, it should be clear that buffer circuit 20 could be implemented by completely reversing the processing techniques (e.g. N-channel to P-channel).

In operation, assume that an input voltage having a low TTL level voltage is coupled to the input at node 25. A low level input voltage causes transistor 24 to be nonconductive and transistor 22 to be conductive. Therefore, a high CMOS logic level of $V_{DD}$ volts is coupled to the output at node 23. When an input voltage having a high TTL level is coupled to node 25, transistor 22 is made nonconductive and transistor 24 is made conductive. Therefore, a low logic level equal to ground potential is coupled to the output at node 23. Transistor 22 thus turns the current on and off to output node 23 and functions as a switching device coupled between current source transistor 21 and current sink transistor 24.

Transistors 22 and 24 comprise a CMOS inverter having a trip point voltage near the TTL mid-range voltage of 1.4 volts. However, transistors 22 and 24 do not function to set the trip point voltage as in a conventional inverter. Depletion transistor 21 and transistor 24 actually function to accurately set the trip point at 1.4 volts. This is because transistor 22 is fabricated with large gate electrode width-to-length physical dimensions so that transistor 22 is always strongly conductive compared to transistor 24 for input voltages of 1.4 volts. When transistor 22 is made to be strongly conductive at 1.4 volts, transistor 22 appears to only be a small resistor connected in series with transistor 21 and does not appreciably affect the current from transistor 21. The current to transistor 22 may thus be limited by depletion transistor 21 so that transistor 22 is forced to operate on the portion of its voltage-current transfer curve where it appears to only be a small resistor. This is accomplished by starving transistor 22 of current via depletion transistor 21 which transistor 22 would normally pull from the $V_{DD}$ supply for the same gate-to-source voltage $V_{GS}$. Since transistors 21 and 24 which are both of the same conductivity type are used to accurately set the switchpoint voltage at 1.4 volts, the switchpoint of buffer circuit 20 will remain very stable and accurate for variations in process and temperature. This is very critical because of the small range of voltages associated with TTL voltages.

Depletion transistor 21 functions as a current source and determines and limits the amount of current sourced to transistor 22. The current source is very precise and exhibits high impedance because of the use of a depletion device. Depletion transistor 21 has a fixed gate-to-source voltage $V_{GS}$ which in this example is zero, and has a very flat voltage-current transfer curve. This is unlike enhancement MOS transistors which each have a family of voltge-current transfer curves. For an enhancement transistor to emulate a depletion transistor, additional complex biasing schemes are required. Such biasing schemes are typically sensitive to power supply variations and noise. However, the current supplied by transistor 21 is not influenced by power supply variations and is only dependent upon its drain-source voltage. Because the gate-to-source voltage of depletion transistor 21 remains constant, transistor 21 has a very high power supply rejection ratio and is not influenced by power supply variation and extraneous noise. Therefore, the use of a depletion type current source instead of a P-channel of N-channel transistor provides superior results.

It should be apparent that when the input voltage is at either ground of $V_{DD}$ volts, transistors 21, 22 and 24 do not provide a current path between voltage terminal $V_{DD}$ and ground terminal. Thus, buffer circuit 20 is conserving power for inputs at both of the rail voltages, ground and $V_{DD}$. It should also be noted that transistor 22 functions as a switching device coupled between a current source transistor 21 and a current sink transistor 24. More importantly, transistor 22 is switched directly in response to the input voltage. Therefore, no additional control voltages are required. Buffer circuit 20 will consume a finite amount of power when the input voltage has a TTL value close to the switchpoint voltage in the same way previous circuits comprising two N-channel series-connected transistors consume power. However, the small amount of power consumption in this situation is not as critical in typical TTL circuits as it is for MOS circuits. For MOS level input voltages, no power is consumed by buffer circuit 20 at the rail voltages.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A TTL to CMOS input buffer circuit for minimizing power consumption, comprising:
   a first MOS transistor of a first conductivity type having a first current electrode coupled to a terminal for receiving a supply voltage, and both a control electrode and a second current electrode connected together, for providing a reference current, said first MOS transistor being a depletion transistor;
   a second MOS transistor of a second conductivity type having a first current electrode coupled to the second current electrode of the first MOS transistor, a control electrode coupled to the single input, and a second current electrode coupled to an output terminal; and
   a third MOS transistor of the first conductivity type having a first current electrode coupled to the output terminal for providing an output voltage having CMOS voltage levels in response to the presence of an input voltage having TTL voltage levels at the single input, a control electrode connected directly to the control electrode of the second MOS transistor at the single input terminal, and a second current electrode coupled to a reference voltage, wherein the second MOS transistor is size ratioed with respect to the third MOS transistor so that the second MOS transistor is strongly conductive with respect to the third MOS transistor at a predetermined switchpoint voltage having a value between said power supply voltage and reference voltage.

2. The TTL to CMOS input buffer circuit of claim 1 wherein the first MOS transistor is an N-channel depletion transistor.

3. The TTL to CMOS input buffer circuit of claim 1 wherein the second MOS transistor is a P-channel enhancement transistor.

4. The TTL to CMOS input buffer circuit of claim 1 wherein the third MOS transistor is an N-channel enhancement transistor.

5. An inverting buffer circuit having a single input terminal for inverting an input voltage having TTL voltage levels to provide an inverted output signal having CMOS levels at an output terminal, and for consuming no power when receiving input voltages having CMOS levels, comprising:
   a high impedance current source means for providing an accurate reference current which is substantially independent of power supply variation;
   a first transistor of a first conductivity type having a first current electrode coupled to the current source means, a control electrode coupled to the input terminal, and a second current electrode coupled to the output terminal, for selectively coupling the current source means to the output terminal in response to the input voltage; and
   a second transistor of a second conductivity type having a first current electrode coupled to the second current electrode of the first transistor, a control electrode connected directly to the control electrode of the first transistor, and a second current electrode coupled to a reference voltage, wherein the first transistor is size ratioed with the second transistor so that the first transistor is strongly conductive compared to the second transistor when both transistors are biased at a predetermined trip point voltage.

6. The inverting buffer circuit of claim 5 wherein the high impedance current source means is a third transistor of the second conductivity type, said third transistor being a depletion transistor having a first current electrode coupled to a supply voltage 7. A buffer circuit which minimizes power dissipation, comprising:
   high impedance current source means for providing a precise reference current which is substantially independent of power supply variations;
   transistor switching means coupled to the current source means for selectively coupling the current source means to an output terminal in response to an input signal; and
   transistor current sink means coupled to the switching means for selectively coupling the output terminal to a reference terminal in response to the input signal, wherein said transistor switching means are size ratioed with the transistor current sink means to make the transistor switching means strongly conductive compared to the transistor current sink means at a predetermined switchpoint voltage.

8. The buffer circuit of claim 7 wherein the current source means comprise:
   a depletion type MOS transistor having a first current electrode coupled to a terminal for receiving a supply voltage, and a control electrode and a second current electrode connected together and coupled to the switching means.

9. The buffer circuit of claim 7 wherein the switching means comprise:
   an MOS transistor having a first current electrode coupled to the current source means, a control electrode connected to a terminal for receiving the input signal, and a second current electrode coupled to the output terminal.

10. The buffer circuit of claim 7 wherein the current sink means comprise:
    an MOS transistor having a first current electrode coupled to the switching means at the output terminal, a control electrode coupled to a terminal for receiving the input signal, and a second current electrode coupled to the reference terminal.

11. An input buffer circuit for minimizing power, comprising:
    a depletion MOS transistor having a first current electrode coupled to a terminal for receiving a supply voltage, and a control electrode connected to a second current electrode, for providing a reference current;
    a P-channel MOS transistor having a first current electrode coupled to the second current electrode of the depletion MOS transistor, a control electrode coupled to an input voltage terminal for receiving an input voltage, and a second current electrode coupled to an output terminal, for coupling the terminal receiving the supply voltage to the output terminal in response to the input voltage; and
    an N-channel MOS transistor having a first current electrode coupled to the second current electrode of the P-channel MOS transistor at the output terminal, a control electrode directly connected to the control electrode of the P-channel MOS transistor at the input voltage terminal, and a second current electrode coupled to a reference voltage terminal, for selectively coupling the reference terminal to the output terminal in response to the input voltage, said P-channel transistor having larger control electrode dimensions than said N-channel transistor so that said P-channel transistor is strongly conductive compared to said N-channel transistor at a predetermined switchpoint voltage.

* * * * *